United States Patent
Huang et al.

(10) Patent No.: US 7,449,889 B1
(45) Date of Patent: Nov. 11, 2008

(54) HEAT PIPE COOLED SUPERCONDUCTING MAGNETS WITH CERAMIC COIL FORMS

(75) Inventors: Xianrui Huang, Clifton Park, NY (US); Bulent Aksel, Clifton Park, NY (US); Kathleen M. Amm, Clifton Park, NY (US); Evangelos T. Laskaris, Schenectady, NY (US); Ernst W. Stautner, Niskayuna, NY (US); Paul S. Thompson, Stephentown, NY (US); Anbo Wu, ShangHai (CN); Minfeng Xu, Ballston Lake, NY (US); Yan Zhao, ShangHai (CN)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/768,016

(22) Filed: Jun. 25, 2007

(51) Int. Cl.
*G01V 3/00* (2006.01)
(52) U.S. Cl. .................... 324/318; 324/309
(58) Field of Classification Search ......... 324/300–322; 600/407–422
See application file for complete search history.

(56) References Cited

U.S. PATENT DOCUMENTS

| | | | |
|---|---|---|---|
| 6,783,059 B2 * | 8/2004 | Laskaris et al. | 324/318 |
| 7,260,941 B2 * | 8/2007 | van Hasselt | 62/6 |
| 7,319,327 B2 * | 1/2008 | Ryan et al. | 324/318 |
| 7,319,329 B2 * | 1/2008 | Huang et al. | 324/319 |
| 2006/0082370 A1 * | 4/2006 | Cirel | 324/318 |
| 2007/0262776 A1 * | 11/2007 | Petropoulos et al. | 324/318 |

* cited by examiner

Primary Examiner—Brij B Shrivastav
(74) Attorney, Agent, or Firm—Jason K. Klindtworth

(57) ABSTRACT

A system and method for a magnetic resonance (MR) imaging system includes a coil form, at least one magnet positioned about the coil form and configured to generate a magnetic field, at least one gradient coil for manipulating the magnetic field generated by the at least one magnet by way of a gradient field, and a heat pipe thermally connected to the coil form and having a cryogen therein. The MR imaging system also includes a cryocooler connected to the heat pipe to cool the heat pipe and the cryogen, wherein the coil form is comprised of a thermally conductive material in which eddy currents are substantially reduced during operation of the at least one gradient coil. The present invention has been described in terms of the preferred embodiment, and it is recognized that equivalents, alternatives, and modifications, aside from those expressly stated, are possible and within the scope of the appending claims.

20 Claims, 3 Drawing Sheets

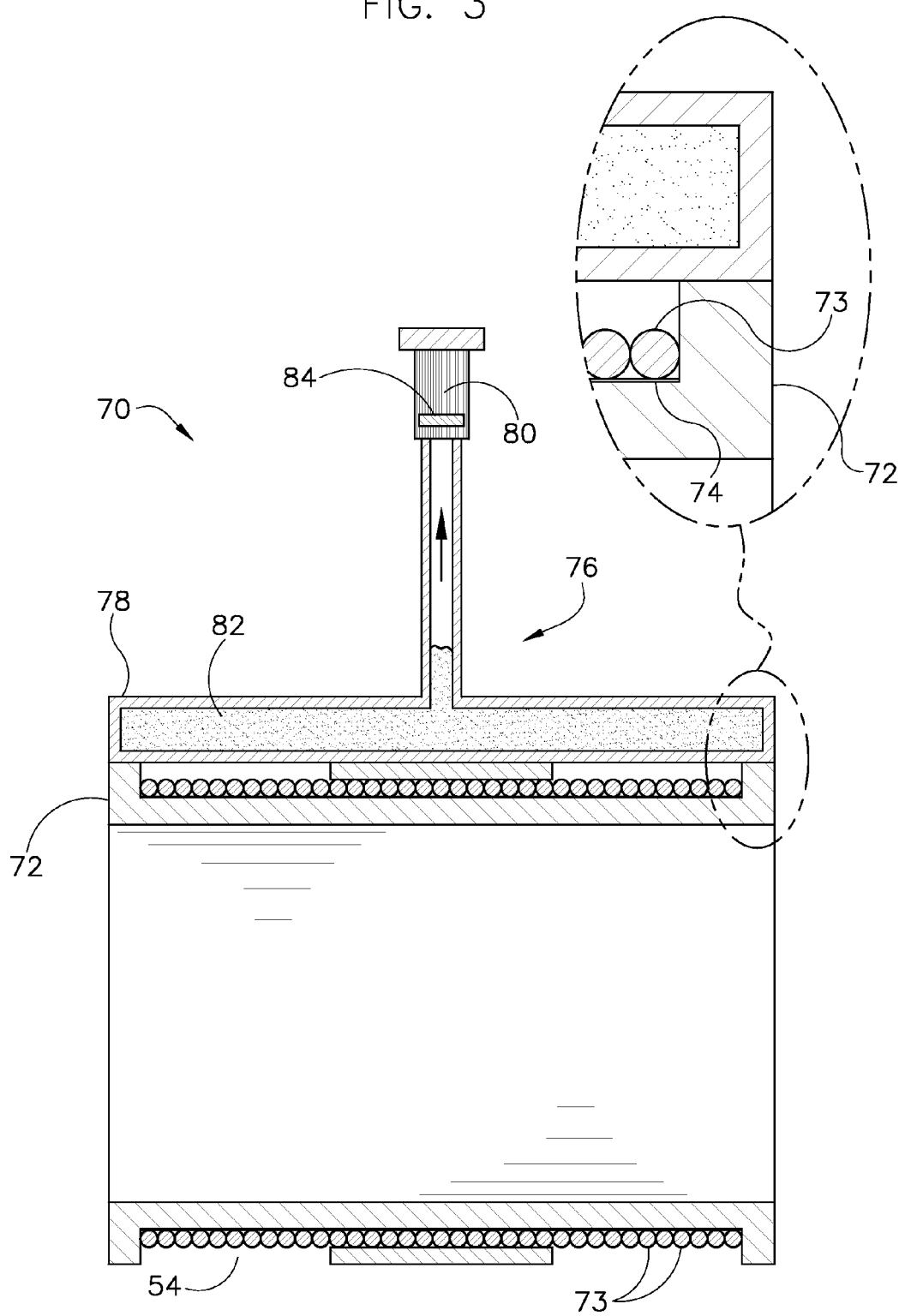

HEAT PIPE COOLED SUPERCONDUCTING MAGNETS WITH CERAMIC COIL FORMS

BACKGROUND OF THE INVENTION

The present invention relates generally to a magnetic resonance imaging (MRI) system and more particularly to a superconducting magnet assembly in the MRI system and a process for manufacturing the superconducting magnet assembly.

MRI systems utilize superconducting magnets to generate a strong, uniform magnetic field within which a patient or other subject is placed. Magnetic gradient coils and radio-frequency transmit and receive coils then influence gyromagnetic materials in the subject to provoke signals that can be used to form useful images. Other systems that use such coils include spectroscopy systems, magnetic energy storage systems, and superconducting generators.

In use with MRI, a superconducting magnet is disposed in a cryostat that includes a thermal shield and a vacuum vessel that insulate the magnet from the environment during operation. The superconducting magnet also has a coil support structure to support the coil in a cold mass and a helium vessel for cooling. The helium vessel is a pressure vessel located within the vacuum vessel for thermal isolation and typically contains liquid helium to provide cooling for the superconducting magnet to maintain a temperature of around 4.2 Kelvin for superconducting operation.

The cryostat and helium vessel components in an MRI system are generally composed of metals such as stainless steel, carbon steel, copper or aluminum. When formed of such metals, the cryostat and helium vessel are strong enough to resist vacuum forces; however, they generate eddy currents and unwanted field distortions in the imaging volume when exposed to an AC field, such as an AC field generated by gradient coils of the MR system. When the magnet is operated in an AC field environment, eddy currents will be induced in those metal components. The eddy currents in the cryostat and helium vessel of a MRI system generate un-wanted field distortions in the imaging volume and adversely affect the image quality. The eddy current heating may also cause structural or thermal problems. That is, the AC losses add to the total heat load and increase costs for maintaining the helium at a cryogenic temperature.

In an effort to minimize the effect of these eddy currents, many conventional MRI systems use a shielded gradient system. Better shielded gradient coils can reduce magnetic coupling; however, such a shielded gradient system is inefficient and requires high current and power. Other compensation techniques can also be used to reduce the impact of the induced current and $B_0$ field changes, but cannot completely eliminate the problem.

Thus, there is a need for reducing field effect losses from eddy currents caused by conventional cryostat and helium vessel configurations and for allowing for the operation of an un-shielded gradient system that operates efficiently without the need for increased power and current.

BRIEF DESCRIPTION OF THE INVENTION

The present invention overcomes the aforementioned drawbacks by providing a superconducting magnet assembly for use in an MRI system, and a method of manufacturing thereof, that reduces the formation of eddy currents. More specifically, the present invention is directed to provide a magnet assembly having a thermal and cooling system that produces very small and negligible eddy currents when exposed to an AC field.

Therefore, in accordance with one aspect of the invention, a magnetic resonance (MR) imaging system includes a coil form, at least one magnet positioned about the coil form and configured to generate a magnetic field, at least one gradient coil for manipulating the magnetic field generated by the at least one magnet by way of a gradient field, and a heat pipe thermally connected to the coil form and having a cryogen therein. The MR imaging system also includes a cryocooler connected to the heat pipe to cool the heat pipe and the cryogen, wherein the coil form is comprised of a thermally conductive material in which eddy currents are substantially reduced during operation of the at least one gradient coil.

In accordance with another aspect of the invention, a method for manufacturing a superconducting magnet assembly including the steps of forming a coil form from a thermally conductive, electrically resistive material in which eddy currents are substantially reduced, positioning a superconducting magnet about the coil form, and thermally bonding a heat pipe to the coil form to transfer a heat load therefrom. The method also includes the steps of connecting a cryocooler to the heat pipe to form a closed system and adding a cryogen to the closed system.

In accordance with yet another aspect of the invention, a superconducting magnet assembly includes a bobbin comprised of a thermally conductive, electrically resistive material and at least one superconducting magnet wrapped about the bobbin and configured to generate a magnetic field. The superconducting magnet cooling system also includes a closed system cooler thermally connected to the bobbin, the closed system cooler comprising a heat pipe thermally bonded to the bobbin, a cryocooler connected to the heat pipe, and a cryogenic refrigerant contained within the heat pipe and the cryocooler.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 3 is a side cross-sectioned view of the magnet assembly of FIG. 2.

DETAILED DESCRIPTION OF THE PREFERRED EMBODIMENT

Figure 1:
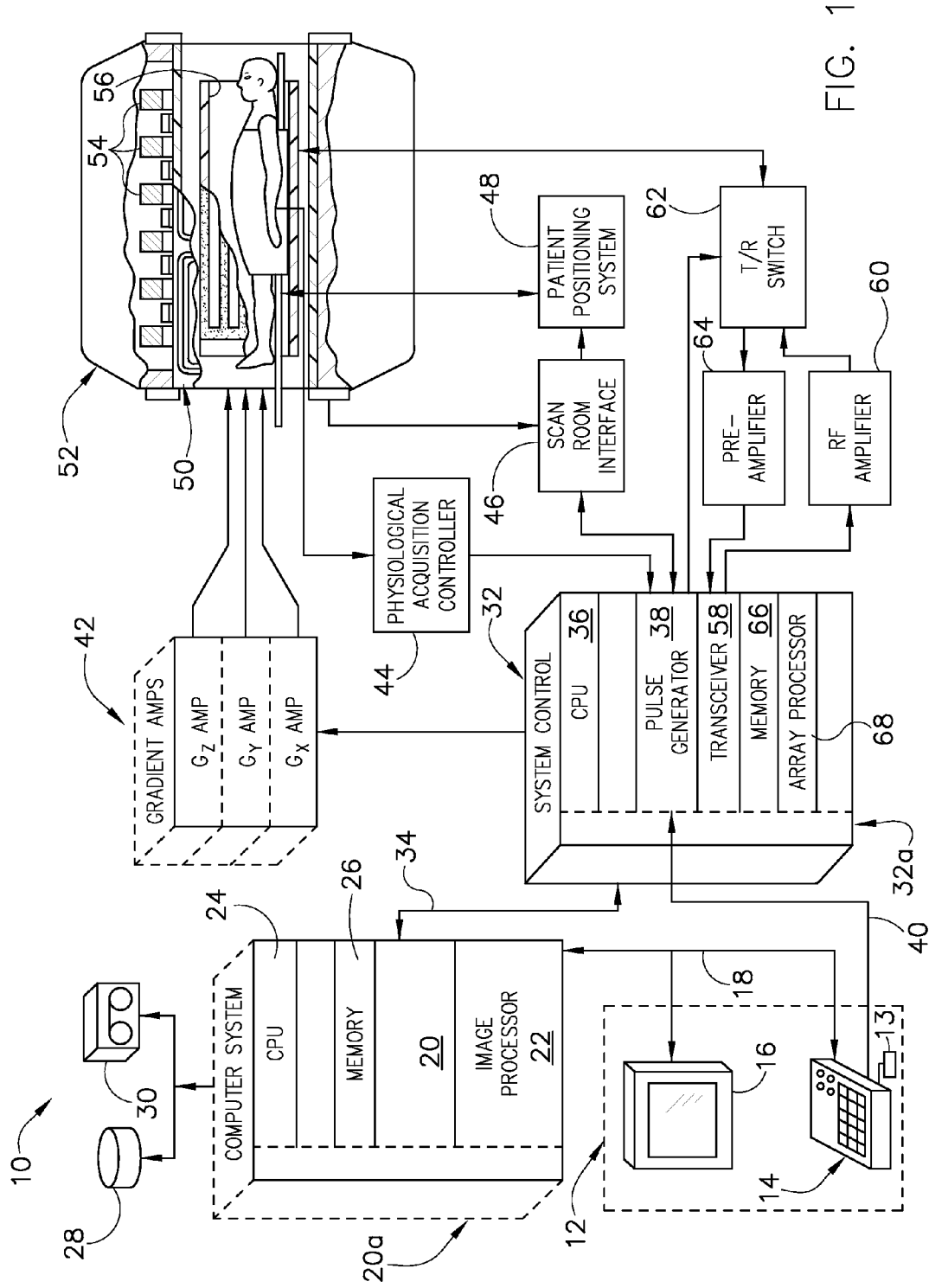
FIG. 1 is a schematic block diagram of an MR imaging system incorporating the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
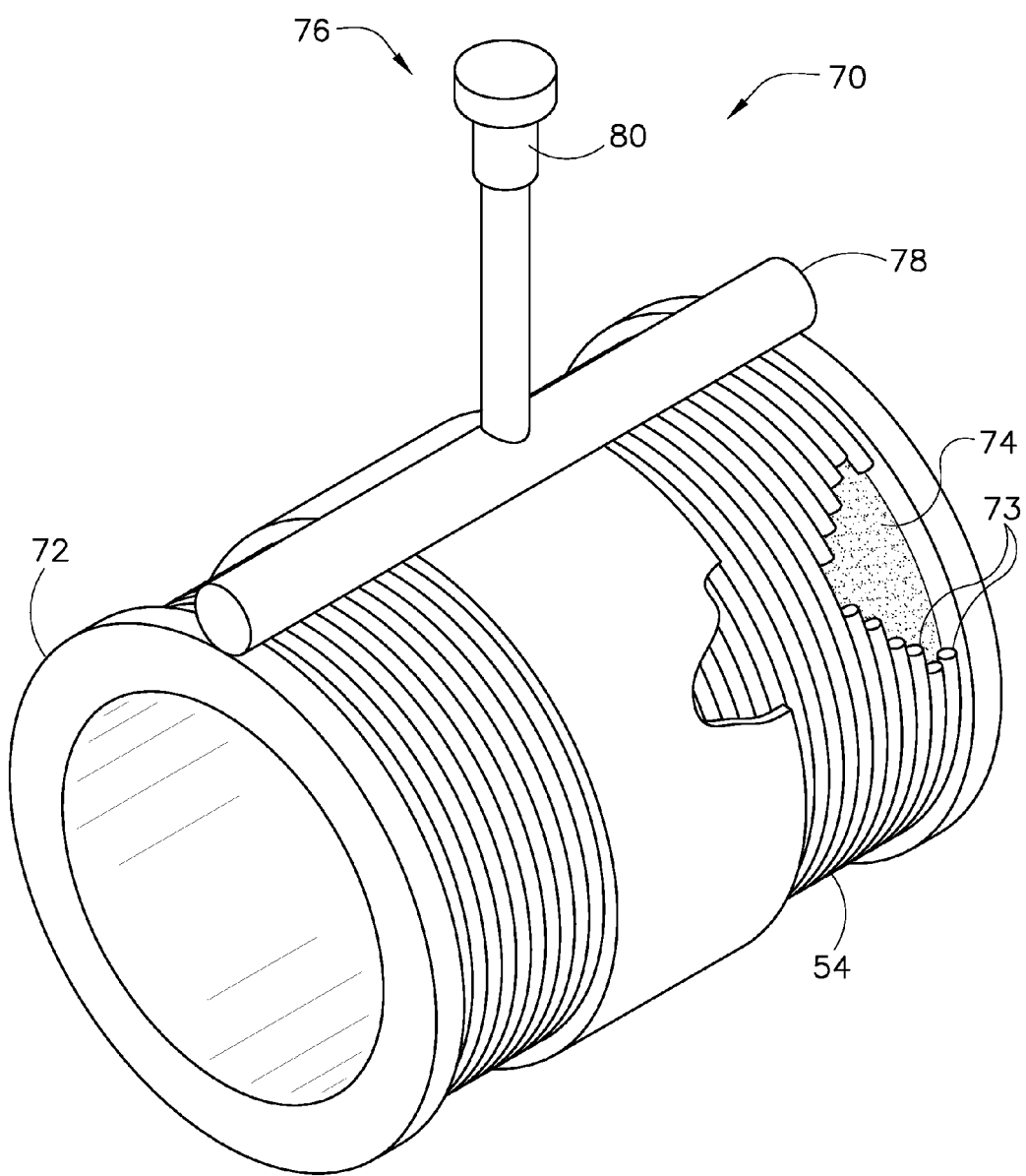
FIG. 2 is a perspective view of a magnet assembly according to an embodiment of the present invention.

As shown in FIG. 2, the superconducting magnet 54 of MRI system 10 is part of a superconducting magnet assembly 70. Superconducting magnet assembly 70 also includes a coil form 72 (i.e., bobbin) around which superconducting magnet 54 is at least partially wound. In the embodiment shown, superconducting magnet 54 is in the form of a plurality of superconducting coils 73 that secured and bonded to coil form 72 by a thermally conductive epoxy 74. The thermally conductive epoxy 74 provides structural support for the superconducting coils 73 and reduces the thermal resistance within the superconducting coils 73 and from the coils 73 to coil form 72.

The coil form 72 is composed of a thermally conductive material in which eddy currents are substantially reduced during operation of the gradient coil array 50 shown in FIG. 1. The material of which coil form 72 is comprised is either a non-metallic material or an insulated metal fiber composite material that is thermally conductive and electrically resistive. In one embodiment, coil form 72 is formed of a ceramic material. The ceramic coil form 72 thus draws heat generated by superconducting magnet 54 away from the magnet coils 73, but also resists the formation of eddy currents when exposed to the changing AC magnetic field formed by the gradient coil array 50 shown in FIG. 1.

A closed system cooler 76 is also included in superconducting magnet assembly 70 and is in thermal contact with coil form 72. The closed system cooler 76 includes a heat pipe 78 that is thermally connected and bonded to coil form 72. The heat pipe 78 is connected to a cryocooler 80 that, together with heat pipe 78, form closed system cooler 76. In one embodiment, heat pipe 78 can be comprised of a composite or plastic material in which eddy currents are substantially reduced during operation of the at least one gradient coil. Referring now to FIG. 3, a cryogenic refrigerant 82 (i.e., cryogen) is also included in closed system cooler 76 in order to transfer a heat load of the coil form 72, generated by way of superconducting magnet 54, to closed system cooler 76. That is, at least a portion of cryogen 82 in closed system cooler 76 is included in heat pipe 78. During operation of superconducting magnet 54, heat that is generated from the magnet is transferred to coil form 72 and is then transferred in turn to heat pipe 78 due to the lower temperature of heat pipe 78 created by cryogen 82. The temperature of cryogen 82 is increased to a boiling point at which the cryogen 82 turns into a gas phase. The cryogen 82 in gas phase flows up out of heat pipe 78 and to cryocooler 80. Cryocooler 80 cools the gaseous cryogen 82 and condenses the cryogen back into liquid form. The cooled cryogen liquid 82 then flows back down into heat pipe 78 to provide for further cooling of coil form 72 and superconducting magnet 54. In this manner, a heat load from the coil form 72 is transferred through heat pipe 78 and to cryocooler 80 by way of cryogen 82 flowing therebetween.

The cryocooler 80 is designed to provide a constant cooling rate or power that is greater than the heat load created by superconducting magnet 54 and transferred to closed system cooler 76 by the connection of heat pipe 78 to coil form 72. Thus, if left unregulated, cryocooler 80 could be cooled to an extent that ice could form on the closed system cooler 76 and affect the performance thereof. To prevent formation of ice and regulate/thermally balance the temperature of cryocooler 80, a heater 84 is attached to cryocooler 80 to maintain a minimum temperature in closed system cooler 76. That is, heater 84 operates to maintain a specified temperature range in closed system cooler 76 that is above a triple point of the cryogen 82 included in closed system cooler 76.

Cryogen 82 included in closed system cooler 76 can be in the form of any of a known number of cryogenic refrigerants that is used for cooling superconducting magnets, and the specific cryogen used is based on a desired operational temperature range of the cryogenic refrigerant that is necessary for the selected superconducting magnet in the MR imaging system. For example, helium with a temperature range of 2 K to 5 K can be used for NbTi and Nb3Sn superconductor magnets. Hydrogen, with a temperature range of 14 K to 30 K, or neon, with a temperature range of 24.6 K to 44 K, can be used for MgB2 or BSCCO superconductor magnets. Also, nitrogen can be used for BSCCO and YBCO superconductors, the nitrogen having a temperature range of 63.1 K to greater than 80 K.

As described above, superconducting magnet 54 can be formed from a variety of superconducting materials. Generally, the material used to form superconducters can be described as a low temperature superconductor (LTS) or as a high temperature superconductor (HTS) based on its critical temperatures for a superconducting operation. NbTi and Nb3Sn require low temperatures for their superconducting operations and are described as LTS. BSCCO and YBCO can operate at higher temperatures and therefore are described as HTS. The MR imaging system 10 described above that includes magnet assembly 70 closed system cooler 76 is especially suited for use with a superconducting magnet formed of a HTS because cryocooler 80 has a larger cooling capacity at higher temperature for a cold mass heat load including the static heat load and the AC losses. It is also envisioned, however, that the above described MR imaging system 10, magnet assembly 70, and closed system cooler 76, include a superconducting magnet formed of a LTS.

Therefore, according to one embodiment of the present invention, a magnetic resonance (MR) imaging system includes a coil form, at least one magnet positioned about the coil form and configured to generate a magnetic field, at least one gradient coil for manipulating the magnetic field generated by the at least one magnet by way of a gradient field, and a heat pipe thermally connected to the coil form and having a cryogen therein. The MR imaging system also includes a cryocooler connected to the heat pipe to cool the heat pipe and the cryogen, wherein the coil form is comprised of a thermally conductive material in which eddy currents are substantially reduced during operation of the at least one gradient coil.

According to another embodiment of the present invention, a method for manufacturing a superconducting magnet assembly includes the steps of forming a coil form from a thermally conductive, electrically resistive material in which eddy currents are substantially reduced, positioning a superconducting magnet about the coil form, and thermally bonding a heat pipe to the coil form to transfer a heat load therefrom. The method also includes the steps of connecting a cryocooler to the heat pipe to form a closed system and adding a cryogen to the closed system.

According to yet another embodiment of the present invention, a superconducting magnet assembly includes a bobbin comprised of a thermally conductive, electrically resistive material and at least one superconducting magnet wrapped about the bobbin and configured to generate a magnetic field. The superconducting magnet cooling system also includes a closed system cooler thermally connected to the bobbin, the closed system cooler comprising a heat pipe thermally bonded to the bobbin, a cryocooler connected to the heat pipe, and a cryogenic refrigerant contained within the heat pipe and the cryocooler.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) imaging system comprising:
   a coil form;
   at least one magnet positioned about the coil form and configured to generate a magnetic field;
   at least one gradient coil for manipulating the magnetic field generated by the at least one magnet by way of a gradient field;
   a heat pipe thermally connected to the coil form and having a cryogen therein;
   a cryocooler connected to the heat pipe to cool the heat pipe and the cryogen; and
   wherein the coil form is comprised of a thermally conductive material in which eddy currents are substantially reduced during operation of the at least one gradient coil.

2. The MR imaging system of claim 1 further comprising a heater attached to the cryocooler, the heater configured to maintain a temperature of the cryocooler above a triple point of the cryogen.

3. The MR imaging system of claim 1 wherein the cryogen is contained in a closed volume formed by the heat pipe and the cryocooler to transfer a heat load from the coil form to the cryocooler.

4. The MR imaging system of claim 1 wherein the magnet further comprises a plurality of superconducting coils wrapped about and secured to the coil form.

5. The MR imaging system of claim 4 wherein the plurality of superconducting coils are thermally bonded to the coil form by a thermally conductive epoxy.

6. The MR imaging system of claim 1 wherein the coil form is comprised of a ceramic material.

7. The MR imaging system of claim 1 wherein the heat pipe is thermally bonded to the coil form.

8. The MR imaging system of claim 1 wherein the cryogen further comprises one of liquid helium, liquid hydrogen, liquid neon and liquid nitrogen.

9. The MR imaging system of claim 1 wherein the magnet is one of a low temperature superconductor (LTS) and a high temperature superconductor (HTS).

10. The MR imaging system of claim 1 wherein the heat pipe is formed of a material in which eddy currents are substantially reduced during operation of the at least one gradient coil.

11. A method for manufacturing a superconducting magnet assembly including the steps of:
   forming a coil form from a thermally conductive, electrically resistive material in which eddy currents are substantially reduced;
   positioning a superconducting magnet about the coil form;
   thermally bonding a heat pipe to the coil form to transfer a heat load therefrom;
   connecting a cryocooler to the heat pipe to form a closed system; and
   adding a cryogen to the closed system.

12. The method of claim 11 further including the step of connecting a heater to the cryocooler to maintain a specified temperature range in the closed system.

13. The method of claim 11 further comprising the step of bonding the superconducting magnet to the coil form with a thermally conductive epoxy.

14. The method of claim 11 wherein the step of forming comprises forming the coil form from a ceramic material.

15. A superconducting magnet assembly comprising:
- a bobbin comprised of a thermally conductive, electrically resistive material;
- at least one superconducting magnet wrapped about the bobbin and configured to generate a magnetic field;
- a closed system cooler thermally connected to the bobbin, the closed system cooler comprising:
  - a heat pipe thermally bonded to the bobbin;
  - a cryocooler connected to the heat pipe; and
  - a cryogenic refrigerant contained within the heat pipe and the cryocooler.

16. The superconducting magnet assembly of claim 15 further comprising a temperature controlled heater, the heater configured to maintain a minimum temperature in the cryocooler.

17. The superconducting magnet assembly of claim 15 wherein the cryocooler is configured to operate at a constant cooling rate that is higher than a heat load transferred from the bobbin.

18. The superconducting magnet assembly of claim 15 wherein the at least one superconducting magnet is bonded to the bobbin by a thermally conductive epoxy.

19. The superconducting magnet assembly of claim 15 wherein the bobbin is comprised of a ceramic material.

20. The superconducting magnet assembly of claim 19 wherein the ceramic bobbin is configured to substantially reduce eddy currents therein during operation of at least one gradient coil positioned within the at least one superconducting magnet.

* * * * *